(12) United States Patent
Kadota et al.

(10) Patent No.: US 9,230,745 B2
(45) Date of Patent: Jan. 5, 2016

(54) VARIABLE CAPACITANCE ELEMENT AND TUNABLE FILTER

(71) Applicant: Murata Manufacturing Co., Ltd., Nagaokakyo-shi, Kyoto-fu (JP)

(72) Inventors: Michio Kadota, Nagaokakyo (JP); Ivoyl P. Koutsaroff, Nagaokakyo (JP); Tetsuya Kimura, Nagaokakyo (JP); Hikari Tochishita, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 129 days.

(21) Appl. No.: 13/973,030

(22) Filed: Aug. 22, 2013

(65) Prior Publication Data

US 2013/0342285 A1 Dec. 26, 2013

Related U.S. Application Data

(63) Continuation of application No. PCT/JP2012/053343, filed on Feb. 14, 2012.

(30) Foreign Application Priority Data

Feb. 25, 2011 (JP) .................................. 2011-039754

(51) Int. Cl.
*H03H 9/64* (2006.01)
*H01G 7/06* (2006.01)
(Continued)

(52) U.S. Cl.
CPC .................. *H01G 7/06* (2013.01); *H03H 9/542* (2013.01); *H03H 9/64* (2013.01); *H03H 9/6403* (2013.01); *H03H 2003/0464* (2013.01)

(58) Field of Classification Search
CPC .......... H01G 7/06; H03H 9/542; H03H 9/566; H03H 9/568; H03H 9/60; H03H 9/605; H03H 9/6403; H03H 9/6423; H03H 9/6479; H03H 9/6483; H03H 2210/02; H03H 2210/025; H03H 9/02559; H03H 2009/02188; H03H 2009/02204; H03H 9/64; H03H 2003/0464
USPC .................... 333/187, 193; 361/277, 280, 281
See application file for complete search history.

(56) References Cited

U.S. PATENT DOCUMENTS 7,315,662 B2 * 1/2008 Hunt et al. .......................... 385/2
7,479,847 B2 * 1/2009 Yamakawa et al. ........... 333/133
(Continued)

FOREIGN PATENT DOCUMENTS

JP 11-260667 A 9/1999
JP 11-261028 A 9/1999
(Continued)

OTHER PUBLICATIONS

Derwent Abstract only for JP 2010-053399 which was cited by Applicants, published Mar. 11, 2010.*

(Continued)

*Primary Examiner* — Barbara Summons
(74) *Attorney, Agent, or Firm* — Keating & Bennett, LLP

(57) ABSTRACT

A variable capacitance element includes a piezoelectric substrate, a buffer layer located on the piezoelectric substrate with an orientation, a dielectric layer located on the buffer layer and having a relative dielectric constant that varies in accordance with an applied voltage, and a first electrode and a second electrode arranged to apply an electric field to the dielectric layer.

8 Claims, 11 Drawing Sheets

(51) Int. Cl.
*H03H 9/54* (2006.01)
*H03H 3/04* (2006.01)

(56) References Cited

U.S. PATENT DOCUMENTS

| | | | |
|---|---|---|---|
| 7,642,882 B2* | 1/2010 | Nam et al. | 333/133 |
| 7,728,483 B2* | 6/2010 | Tanaka | 310/313 R |
| 7,854,049 B2* | 12/2010 | Yoshino et al. | 29/25.35 |
| 8,264,303 B2* | 9/2012 | Suzuki | 333/193 |
| 8,848,336 B2* | 9/2014 | Koutsaroff et al. | 361/321.4 |
| 2001/0048352 A1* | 12/2001 | Klee et al. | 333/188 |
| 2005/0110596 A1 | 5/2005 | Yamakawa et al. | |

FOREIGN PATENT DOCUMENTS

| | | |
|---|---|---|
| JP | 2004-221128 A | 8/2004 |
| JP | 2008-054046 A | 3/2008 |
| JP | 2008-085081 A | 4/2008 |
| JP | 2010-053399 A | 3/2010 |

OTHER PUBLICATIONS

Hirano et al.; "Thin Film Transfer Technology for Tunable SAW Filter Using Integrated Ferroelectric Varactors"; 2011 IEEE International Ultrasonics Symposium (IUS); Oct. 18-21, 2011, pp. 1960-1963 and 1 page IEEE Xplore abstract.*

Komatsu et al.; "Tunable Radio-Frequency Filters Using Acoustic Wave Resonators and Variable Capacitors"; Japanese Journal of Applied Physics 49 (2010), 07HD24 pp. 1-4, published online Jul. 20, 2010.*

Official Communication issued in International Patent Application No. PCT/JP2012/053343, mailed on May 22, 2012.

* cited by examiner

VARIABLE CAPACITANCE ELEMENT AND TUNABLE FILTER

BACKGROUND OF THE INVENTION

1. Field of the Invention

The present invention relates to a variable capacitance element that includes a dielectric layer whose relative dielectric constant varies in accordance with an applied voltage, and in particular, relates to a variable capacitance element that includes such a dielectric film and that is provided on a piezoelectric substrate, and to a tunable filter that includes the variable capacitance element.

2. Description of the Related Art

To date, a variable capacitance element whose capacitance can be varied has been widely used in an electronic component. As such a variable capacitance element, Japanese Unexamined Patent Application Publication No. 11-260667 discloses, for example, a variable capacitance element in which a barium strontium titanate film is formed as a dielectric layer on a ceramic substrate.

Meanwhile, for mobile communication devices such as a cellular phone, there is a strong demand for reducing the size and weight of electronic components. In order to meet such a demand, piezoelectric devices such as a piezoelectric resonator and a piezoelectric filter are widely used.

In Japanese Unexamined Patent Application Publication No. 2008-54046 listed below, a piezoelectric filter illustrated in FIG. 19 is disclosed as an example of this type of piezoelectric device. A piezoelectric filter 1001 includes a series piezoelectric resonator 1002 and parallel piezoelectric resonators 1003 and 1004. An inductor 1005 is connected between the parallel piezoelectric resonator 1003 and the ground potential. Further, an inductor 1006 is connected between the parallel piezoelectric resonator 1004 and the ground potential. Furthermore, a bypass piezoelectric resonator 1007 is connected between a node between the parallel piezoelectric resonator 1003 and the inductor 1005 and a node between the parallel piezoelectric resonator 1004 and the inductor 1006. A variable capacitor 1008 is connected in parallel with the bypass piezoelectric resonator 1007.

FIG. 20 is a schematic plan view of the piezoelectric filter 1001, and FIG. 21 is a schematic cross-sectional view of a portion along the A-A line in FIG. 20. The piezoelectric filter 1001 includes a substrate 1009 that is formed of a silicon or glass substrate or the like. The series piezoelectric resonator 1002 and the parallel piezoelectric resonators 1003 and 1004 are formed of piezoelectric thin film resonators that are provided on the substrate 1009. For example, as illustrated in FIG. 21, the series piezoelectric resonator 1002 and the bypass piezoelectric resonator 1007 are configured as piezoelectric thin film resonators over cavities 1009a and 1009b that are provided in the substrate 1009.

Meanwhile, the variable capacitor 1008 for adjusting filter characteristics is formed of a lower electrode 1011, a dielectric layer 1012, and an upper electrode 1013 that are stacked in this order on an insulator layer 1010 that is provided on the substrate 1009. Japanese Unexamined Patent Application Publication No. 11-260667 indicates that the dielectric layer 1012 is formed of barium strontium titanate ($Ba_xSr_{1-x}TiO_3$) or the like.

In addition, Japanese Unexamined Patent Application Publication No. 2008-54046 discloses that the insulator layer 1010 is formed of silicon dioxide, silicon nitride, or the like, and the lower electrode 1011 is formed of the same material as the lower electrode of the piezoelectric thin film resonator, such as Mo, Al, Ag, W, Pt, or the like.

According to Japanese Unexamined Patent Application Publication No. 11-260667, since a variable capacitance element having a dielectric layer of barium strontium titanate formed on a ceramic substrate can be provided, a small-sized element with a large capacitance variation can be obtained.

However, a dielectric layer of barium strontium titanate could be deposited well only on specific substrates such as a ceramic substrate of alumina or the like or a semiconductor substrate. Accordingly, in a case where a piezoelectric substrate for, for example, a surface acoustic wave device, a boundary acoustic wave device, or a Lamb wave device is used, a variable capacitance element that includes a dielectric layer having good characteristics and formed of barium strontium titanate could not be formed on the piezoelectric substrate.

Further, the deposition temperature of BST is as high as 800° C. to 900° C. Therefore, if a BST film is to be formed on a piezoelectric substrate that is formed of a piezoelectric material having a low Curie temperature, there is a risk of the piezoelectric characteristics thereof being degraded. Further, there are also such problems as the piezoelectric substrate warping or breaking and the BST film peeling off.

According to Japanese Unexamined Patent Application Publication No. 2008-54046, the variable capacitance is formed of a layered body of the lower electrode 1011, the ferroelectric layer 1012, and the upper electrode 1013, and thus a variable capacitance structure portion can be reduced in size and in thickness.

Here, if the variable capacitance element disclosed in Japanese Unexamined Patent Application Publication No. 11-260667 is to be used in a piezoelectric device, an excellent BST film cannot be formed on the piezoelectric substrate, as described above. Therefore, as indicated in Japanese Unexamined Patent Application Publication No. 2008-54046 as well, a piezoelectric thin film resonator needed to be constructed by forming a piezoelectric layer on the substrate 1009 that is formed of a glass or silicon substrate, and then, the variable capacitance element needed to be constructed separately.

Thus, the piezoelectric device could not be reduced in size. Further, interconnect resistance occurred between the piezoelectric resonator and the variable capacitance element, degradation of the characteristics occurred due to a parasitic component, and in turn the characteristics of the obtained piezoelectric device were not sufficient.

It should be noted that, in a modification of a fourth preferred embodiment described in Japanese Unexamined Patent Application Publication No. 2008-54046, a tunable filter is disclosed in which a variable capacitance element formed of a surface acoustic wave resonator and a varactor diode is formed on a piezoelectric substrate. In this modification, the variable capacitance element is formed of the varactor diode and is different from a variable capacitor that includes the ferroelectric layer.

SUMMARY OF THE INVENTION

Preferred embodiments of the present invention provide a variable capacitance element that includes a dielectric layer whose relative dielectric constant varies in accordance with an applied voltage and that is located on a piezoelectric substrate. Preferred embodiments of the present invention also provide a tunable filter that includes a variable capacitor according to another preferred embodiment of the present invention and a piezoelectric resonant device that are located on a piezoelectric substrate and that is significantly reduced in size and in thickness.

A variable capacitance element according to a preferred embodiment of the present invention includes a piezoelectric substrate, a buffer layer that is located on the piezoelectric substrate and has an orientation, a dielectric layer that is located on the buffer layer and whose relative dielectric constant varies in accordance with an applied voltage, and a first electrode and a second electrode that are arranged to apply an electric field to the dielectric layer.

In a particular aspect of a variable capacitance element according to a preferred embodiment of the present invention, the buffer layer has a cubic crystal structure, and primarily a (111) plane or a plane that is equivalent to the (111) plane is oriented in a direction parallel or substantially parallel to a surface of the piezoelectric substrate. Alternatively, the buffer layer has a trigonal or hexagonal crystal structure, and primarily a (001) plane or a plane that is equivalent to the (001) plane is oriented in a direction parallel or substantially parallel to a surface of the piezoelectric substrate. In this case, the variable capacitance element having small tan δ or dielectric loss can be provided.

In another particular aspect of a variable capacitance element according to a preferred embodiment of the present invention, the buffer layer has a cubic crystal structure, and primarily a (11X) plane other than the (111) plane or a plane that is equivalent to the (11X) plane is oriented on the piezoelectric substrate, or primarily a (10X) plane or a plane that is equivalent to the (10X) plane is oriented on the piezoelectric substrate. Alternatively, the buffer layer has a trigonal or hexagonal crystal structure, and primarily a (11X) plane or a (10X) plane, or a plane that is equivalent to the (11X) plane or the (10X) plane is oriented on the piezoelectric substrate. In this case, the relative dielectric constant of the dielectric layer in the variable capacitance element can be varied even further. Note that X represents an integer.

In yet another particular aspect of a variable capacitance element according to a preferred embodiment of the present invention, the buffer layer includes an epitaxial film. In this case, the buffer layer has the crystal orientation of the piezoelectric substrate.

In yet another particular aspect of a variable capacitance element according to a preferred embodiment of the present invention, the buffer layer having the cubic crystal structure includes at least one material selected from a group consisting of W, Al, Cu, Ag, Au, Ni, Ir, SrRuO$_3$, RuO$_2$, TiN, ZrN, TaSiN, TiAlN, LaNiO$_3$, SrIrO$_3$, LaTiO$_2$N, and (La,Sr)TiO$_x$N$_y$. Alternatively, the buffer layer having the trigonal or hexagonal crystal structure includes at least one material selected from a group consisting of Ru, TaN, TaSiN, TiAlN, and ZnO. In this case, a low resistance film can be realized, which can double as an electrode layer.

In yet another particular aspect of a variable capacitance element according to a preferred embodiment of the present invention, the piezoelectric substrate is preferably made of LiNbO$_3$ or LiTaO$_3$, for example. In this case, small, thin, and preferable characteristics can be realized.

In yet another particular aspect of a variable capacitance element according to a preferred embodiment of the present invention, a material that constitutes the dielectric layer preferably is BaSrTiO$_3$, for example. In this case, the variable capacitance element in which electrostatic capacity varies greatly in accordance with an applied voltage can be provided.

In yet another particular aspect of a variable capacitance element according to a preferred embodiment of the present invention, the dielectric layer is doped with at least one material selected from a group consisting of N, Gd, Ca, Zr, Hf, and Ge. In this case, by being doped with at least one among the above elements, a variable capacitance range is significantly increased.

A tunable filter according to a preferred embodiment of the present invention includes a resonator circuit unit that is located on a piezoelectric substrate on which the variable capacitance element constructed according to one of the other preferred embodiments of the present invention is located and that includes a piezoelectric resonant device connected to an input terminal and an output terminal, and the variable capacitance element, which is connected to the resonator circuit unit. Accordingly, a small and thin tunable filter can be provided. Further, since a capacitance element that can obtain good variable characteristics is arranged in adjacent to the piezoelectric resonant device, interconnect resistance between the resonant device and the variable capacitance element is significantly reduced, and degrading in the characteristics due to a parasitic component can be significantly reduced or prevented. Accordingly, good filter characteristics can be obtained.

In another particular aspect of a tunable filter according to a preferred embodiment of the present invention, the piezoelectric resonant device is provided in a plurality, and a ladder circuit is defined by the plurality of piezoelectric resonant devices.

In yet another particular aspect of a tunable filter according to a preferred embodiment of the present invention, the resonator circuit unit has a ladder circuit configuration that includes a series arm which connects an input terminal with an output terminal and a parallel arm which connects the series arm with a ground potential, and the series arm and the parallel arm include at least one or more piezoelectric resonators.

In yet another particular aspect of a tunable filter according to a preferred embodiment of the present invention, a capacitance element that cuts out a direct current signal is connected in series with the variable capacitance element of the tunable filter.

In yet another particular aspect of a tunable filter according to a preferred embodiment of the present invention, a resistor or an inductor that cuts out a high-frequency signal is connected between the variable capacitance element and a ground or between the variable capacitance element and a direct current power supply.

In the tunable filter according to a preferred embodiment of the present invention, the piezoelectric resonant device may be a SAW device, a BAW device, or a Lamb-wave device, for example.

In yet another particular aspect of a tunable filter according to a preferred embodiment of the present invention, the piezoelectric resonant device is a SAW device in which a transversal wave is a main component.

In yet another particular aspect of a tunable filter according to a preferred embodiment of the present invention, the piezoelectric substrate on which the variable capacitance element is provided preferably is rotated Y cut LiTaO$_3$ or rotated Y cut LiNbO$_3$ and has a rotation angle of 90°±30°, for example. In this case, since a large electromechanical coupling coefficient can be obtained, the frequency variable width of the tunable filter can be increased.

In yet another particular aspect of a tunable filter according to a preferred embodiment of the present invention, the piezoelectric resonant device is a BAW device in which a thickness-shear vibration mode is a main component. In this case, since an IDT electrode is not necessary, a filter that excels in the electric power handling capability than the SAW can be realized.

In yet another particular aspect of a tunable filter according to a preferred embodiment of the present invention, the piezoelectric resonant device is a Lamb-wave device in which a transversal wave vibration mode is a main component. In this case, since the electromechanical coupling coefficient that is even greater than the surface acoustic wave can be obtained, the frequency variable width can be increased further.

In a variable capacitance element according to a preferred embodiment of the present invention, a dielectric layer whose relative dielectric constant varies in accordance with an applied voltage is located on a piezoelectric substrate with a buffer layer having an orientation interposed therebetween, and first and second electrodes are arranged to apply an electric field to the dielectric layer. Accordingly, the variable capacitance element that is located on the piezoelectric substrate and that includes the dielectric layer with a large relative dielectric constant variable range is provided. Further, the structure in which the variable capacitance element is combined into a piezoelectric device such as a piezoelectric resonator and a piezoelectric filter in which a piezoelectric substrate is included is significantly reduced in size and in thickness, and a significant improvement in the characteristics is achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention will be described with reference to the drawings to clarify the present invention.

Figure 1:
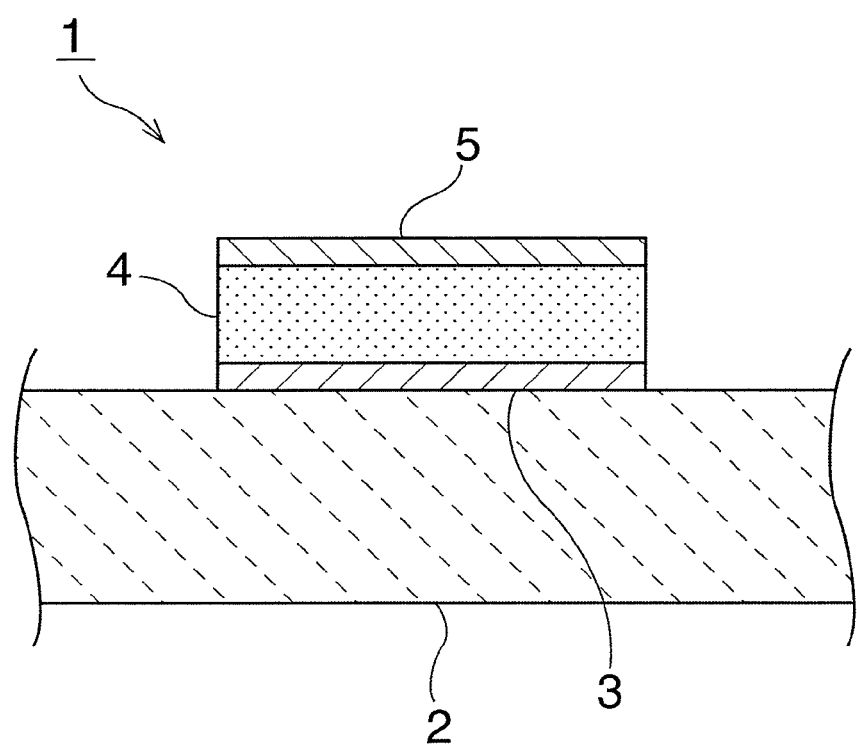
FIG. 1 is a partial cutaway front cross-sectional view illustrating a variable capacitance element according to a first preferred embodiment of the present invention.

FIG. 1 is a partial cutaway front cross-sectional view for describing a variable capacitance element according to a first preferred embodiment of the present invention.

A variable capacitance element 1 includes a piezoelectric substrate 2. The piezoelectric substrate 2 includes an appropriate piezoelectric material such as $LiTaO_3$, $LiNbO_3$, or other suitable material, for example. Preferably, a piezoelectric substrate that includes rotated Y cut $LiTaO_3$ or rotated Y cut $LiNbO_3$ having a rotation angle of 90°±30° is used, for example, which will be described later. In that case, since the electromechanical coupling coefficient is large, a tunable filter with large frequency variable width can be constructed.

A buffer layer 3 is located on the piezoelectric substrate 2. Further, a dielectric layer 4 and a second electrode 5 are stacked on the buffer layer 3. In the present preferred embodiment, the buffer layer 3 includes Pt and doubles as a first electrode. Accordingly, the buffer layer 3, that is, the first electrode, and the second electrode 5 are stacked with the dielectric layer 4 interposed therebetween, and thus a capacitor portion that extracts electrostatic capacity is located of the buffer layer 3, the dielectric layer 4, and the second electrode 5. The dielectric layer 4 includes a dielectric material whose relative dielectric constant varies in accordance with an applied voltage. Accordingly, with the variable capacitance element 1, the electrostatic capacity can be varied by varying the applied voltage. Further, a plurality of buffer layers may be stacked.

As an example of the material that defines the dielectric layer 4 whose relative dielectric constant varies in accordance with the applied voltage, BST, that is, barium strontium titanate ($Ba_xSr_{1-x}TiO_3$, here, x is a number that is greater than 0 but less than 1) can be provided.

The relative dielectric constant of BST varies greatly when a voltage is applied thereto. Accordingly, by using BST, the variable capacitance element 1 whose electrostatic capacity can be varied greatly is provided.

To date, it has been considered that a BST film cannot be deposited well on a substrate other than a sapphire or MgO substrate. That is, since the deposition temperature of BST is as high as 800° C. to 900° C., it has been considered to be difficult to form a BST film directly on a piezoelectric substrate of $LiTaO_3$, $LiNbO_3$, or the like. Thus, it has been considered that BST can be deposited directly only on sapphire or MgO.

The present inventors have diligently examined the above point and discovered that BST can be deposited well if, in a case where the piezoelectric substrate 2 including $LiNbO_3$ is used, a buffer layer including Pt that is oriented in a specific direction is formed and then BST is deposited on that buffer layer.

In the present preferred embodiment, on the piezoelectric substrate 2, the buffer layer 3 includes a Pt film having a cubic crystal structure in which primarily a (111) plane is oriented in a direction parallel or substantially parallel to a surface of the piezoelectric substrate 2. Accordingly, the dielectric layer 4 including BST can be directly deposited on this buffer layer 3 through sputtering or the like, and thus, the dielectric layer 4 having a large relative dielectric constant variable range can be provided.

It should be noted that a Pt film in which the (111) plane is oriented in a direction parallel or substantially parallel to the surface of the piezoelectric substrate 2 is preferably used as the buffer layer 3 in the present preferred embodiment, as described above. This Pt film will be abbreviated to a Pt(111) film, hereinafter.

Although the aforementioned Pt(111) film is used as the buffer layer 3 in the present preferred embodiment, the orientation direction of the buffer layer 3 and the material forming the buffer layer 3 are not limited to the above. That is, the orientation direction of the buffer layer 3 may be (111), (10X), (11X) other than (111), or the like. Note that X in the aforementioned orientation directions represents an integer.

Further, an orientation plane may be a plane that is equivalent to any of the aforementioned orientation planes. That is, a plane that is equivalent to the (111) plane may be oriented parallel or substantially parallel to the piezoelectric substrate 2. Similarly, a plane that is equivalent to (10X) or a plane that is equivalent to the (11X) plane other than the (111) plane may be oriented on the piezoelectric substrate 2.

Further, the crystal structure of the buffer layer 3 is not limited to a cubic crystal structure and may be a trigonal or hexagonal crystal structure.

Preferably, if the buffer layer 3 has a cubic crystal structure, the (111) plane or a plane that is equivalent to the (111) plane is desirably oriented in a direction parallel to the piezoelectric substrate 2, and if the buffer layer 3 has a trigonal or hexagonal crystal structure, a (001) plane or a plane that is equivalent to the (001) plane is desirably oriented in a direction parallel or substantially parallel to the surface of the piezoelectric substrate 2. In that case, the variable capacitance element 1 having small tan δ or dielectric loss can be obtained.

Further, if the buffer layer 3 has a cubic crystal structure, the (10X) plane or a plane that is equivalent to the (10X) plane, or the (11X) plane other than the (111) plane or a plane that is equivalent to the (11X) plane is desirably oriented on the piezoelectric substrate 2. Here, the orientation of the (10X) plane or a (11X) plane other than the (111) plane in a cubic crystal structure is perpendicular or substantially perpendicular to the Y-axis of the piezoelectric substrate. In that case, a change in the relative dielectric constant in the dielectric layer 4 caused by an applied voltage can be further increased. Similarly, if the buffer layer 3 has a trigonal or hexagonal crystal structure, the (11X) plane or a plane that is equivalent to the (11X) plane, or the (10X) plane or a plane that is equivalent to the (10X) plane is desirably oriented on the piezoelectric substrate 2. Here, the orientation of the (11X) plane or the (10X) plane in a trigonal or hexagonal crystal structure is perpendicular to the Y-axis of the piezoelectric substrate. In that case, a change in the relative dielectric constant in the dielectric layer 4 caused by an applied voltage can be increased. Note that X represents an integer.

Through the crystal structure and the orientation direction described above, tan δ can be reduced and a change in the relative dielectric constant caused by an applied voltage can be increased, and the configurations enabling the above will be described in further detail with reference to Example 1 and Example 2 that are described later.

Further, although the buffer layer 3 is oriented in a specific direction as described above, preferably, the buffer layer 3 includes an epitaxial film that is formed through epitaxial growth. In that case, the buffer layer 3 can be formed while reflecting the crystal orientation of the piezoelectric substrate 2. Accordingly, the buffer layer 3 that is oriented in a specific direction can easily be provided. As the material for forming the buffer layer 3, not only Pt but various other materials can be used. Further, it is preferable the buffer layer 3 doubles as the first electrode in the present preferred embodiment. However, the material forming the buffer layer 3 may be a material that does not have electrical conductivity that is sufficient to form an electrode. In that case, the first electrode may be provided separately on a lower surface of the buffer layer 3. As the material forming such a first electrode, an appropriate metal such as Pt, Au, and Ag can be used, for example.

Meanwhile, the material forming the buffer layer having the cubic crystal structure preferably includes at least one material selected from a group consisting of W, Al, Cu, Ag, Au, Ni, Ir, $SrRuO_3$, $RuO_2$, TiN, ZrN, TaSiN, TiAlN, $LaNiO_3$, $SrIrO_3$, $LaTiO_2N$, and $(La,Sr)TiO_xN_y$, for example. In this case, a buffer layer that is oriented in a specific direction can easily and reliably be provided.

Further, the material of the buffer layer having the trigonal or hexagonal crystal structure includes at least one material selected from a group consisting of Ru, TaN, TaSiN, TiAlN, and ZnO. In this case as well, a buffer layer that is oriented in the above-described specific direction can easily be provided.

Figure 2A:
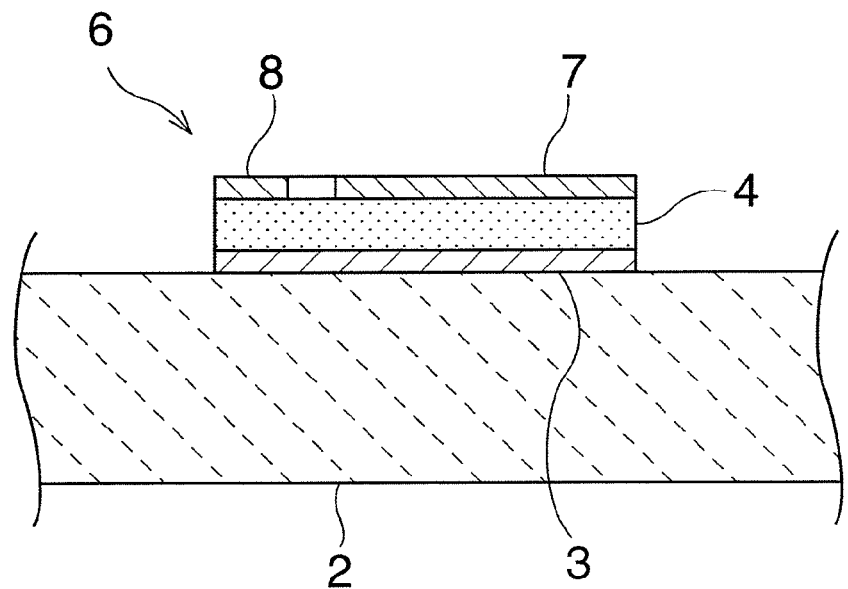
FIG. 2A is a partial cutaway front cross-sectional view illustrating a variable capacitance element according to a second preferred embodiment of the present invention.
Figure 2B:
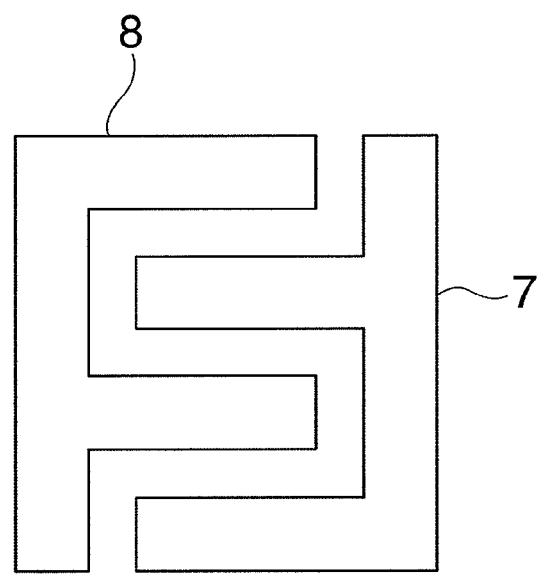
FIG. 2B is a plan view illustrating an electrode structure thereof.

FIG. 2A is a partial cutaway front cross-sectional view for describing a variable capacitance element 6 according to a second preferred embodiment of the present invention, and FIG. 2B is a plan view illustrating an electrode structure thereof.

As illustrated in FIG. 2A, in the variable capacitance element 6 of the second preferred embodiment, the buffer layer 3 and the dielectric layer 4 are stacked in this order on the piezoelectric substrate 2. Here, the buffer layer 3 does not double as the first electrode. Of course, the piezoelectric substrate 2, the buffer layer 3, and the dielectric layer 4 can be formed similarly to those in the first preferred embodiment with similar materials. Accordingly, portions that are identical to those in the first preferred embodiment are given identical reference numerals, and the descriptions thereof will be omitted. It should be noted that since the buffer layer 3 does not double as the first electrode, the buffer layer 3 may be formed of a material that does not have electrical conductivity, as mentioned earlier.

In the variable capacitance element 6 according to the second preferred embodiment of the present invention, a first electrode 7 and a second electrode 8 are provided on an upper surface of the dielectric layer 4. The first electrode 7 and the second electrode 8 are comb-shaped electrodes, and a plurality of electrode fingers of the respective electrodes are mutually interdigitated. In this way, the first electrode 7 and the second electrode 8 according to a preferred embodiment of the present invention preferably include a pair of comb-shaped electrodes that are stacked on one surface of the dielectric layer 4.

That is, in a preferred embodiment of the present invention, as long as the first electrode and the second electrode are arranged so as to face each other on the dielectric layer 4, a mode of the orientation thereof is not particularly limited.

With reference to Example 1 and Example 2, it will be described below that tendencies of changes in tan δ and in the relative dielectric constant in accordance with an applied voltage vary depending on the crystal structure and the orientation direction of the buffer layer.

Example 1

A buffer layer 3 having a cubic crystal structure and formed of a Pt(111) film was deposited in a thickness of 100 nm on a piezoelectric substrate 2 formed of 15° Y cut LiNbO$_3$ through sputtering using an Ar gas at a substrate temperature of 400° C. A dielectric layer 4 formed of BaSrTiO$_3$ was then formed on the buffer layer 3 through sputtering at a temperature of 700° C. A second electrode 5 formed of Pt was then formed as a film in a thickness of 200 nm on the dielectric layer 4 through sputtering to obtain a variable capacitance element 1. Relationships between a dielectric constant and an applied voltage and between tan δ and the applied voltage in this variable capacitance element are illustrated in FIG. 3.

Figure 3:
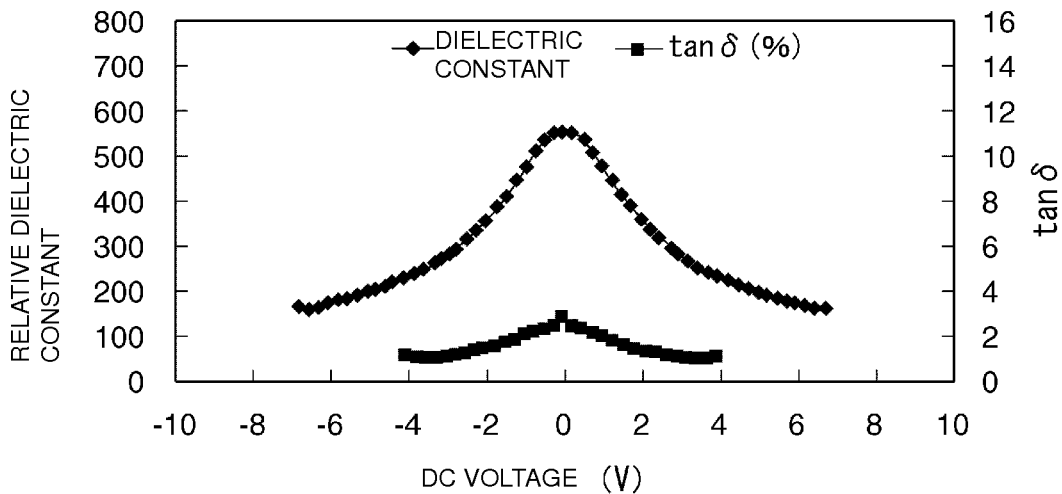
FIG. 3 is a diagram illustrating relationships between a relative dielectric constant and an applied voltage and between tan δ and the applied voltage in a variable capacitance element of Example 1, in which a buffer layer including a Pt(111) film and a BST film are stacked on a piezoelectric substrate that includes 15° Y cut $LiNbO_3$ and further a Pt film is stacked thereon as a second electrode.

FIG. 3 clearly reveals that as the applied voltage changed, the relative dielectric constant and tan δ also changed. The rate of change in the relative dielectric constant, that is, the ratio of the highest relative dielectric constant to the lowest relative dielectric constant within a range where the applied voltage is between −5 V and +5 V was 2.78.

Figure 5:
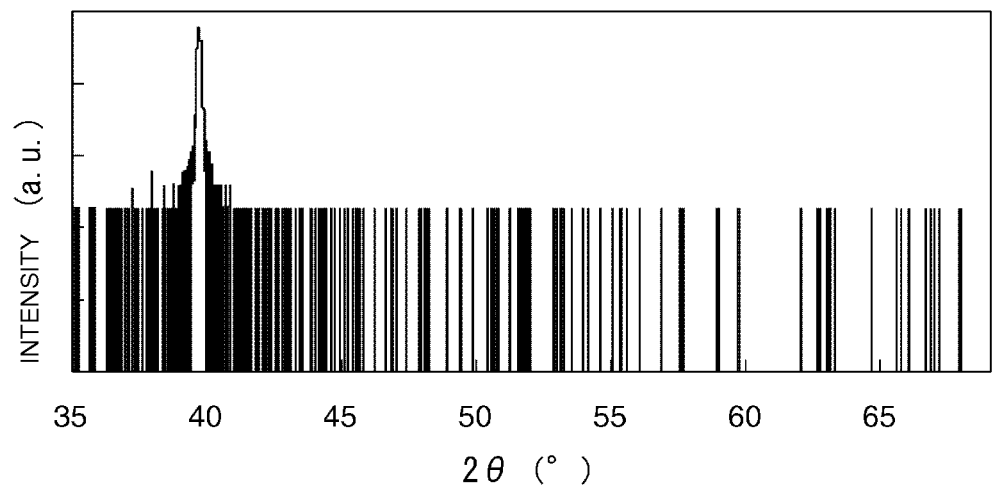
FIG. 5 is a diagram illustrating an x-ray diffraction result of Example 1 having a structure in which the buffer layer including Pt(111) and the BST film are stacked on the piezoelectric substrate that includes 15° Y cut $LiNbO_3$.

Further, the variable capacitance element of Example 1 was analyzed through x-ray diffraction, and the orientation direction was confirmed. The result is illustrated in FIG. 5. FIG. 5 clearly reveals that a peak for the Pt(111) plane was observed, which indicated that the buffer layer 3 was Pt(111).

Here, although there is actually a peak for other than the Pt(111) plane as well, as in the present preferred embodiment, as long as the buffer layer 3 has a relatively strong peak for the (111) plane, a BST film is deposited well thereon. In other words, it is sufficient as long as the Pt(111) plane is primarily oriented. The above applies similarly in other preferred embodiments in the present invention in that it is sufficient as long as each orientation plane is primarily deposited.

Figure 6:
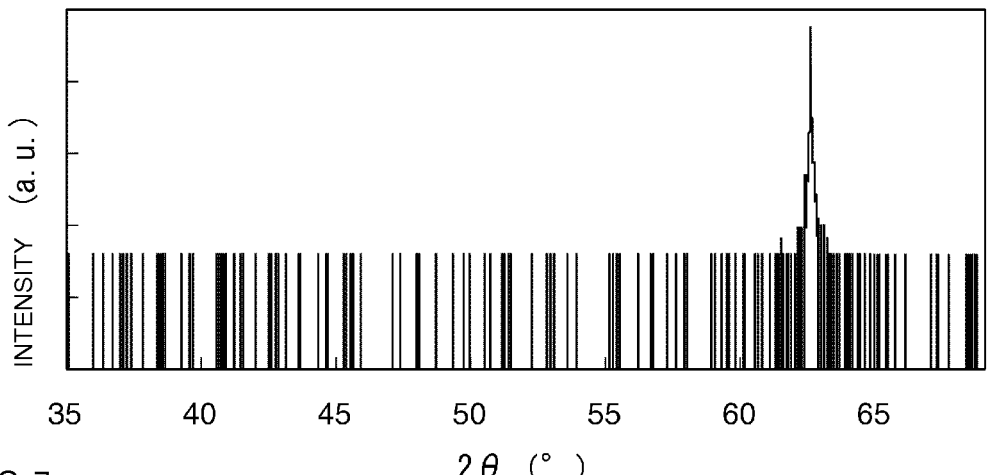
FIG. 6 is a diagram illustrating an x-ray diffraction result of measurement taken with a surface direction of Example 1 being inclined by 15° to match with the Y-plane of $LiNbO_3$.

Further, the result of the measurement obtained through x-ray diffraction with the surface direction of the variable capacitance element being inclined by 15° from the horizontal direction is illustrated in FIG. 6. FIG. 6 clearly reveals that a peak for the (300) plane of the LiNbO$_3$ substrate was observed. In other words, a peak resulting from 15° Y cut LiNbO$_3$ was observed.

Example 2

Similarly to Example 1, but a Pt(200) film having a cubic crystal structure was deposited as the buffer layer 3. The deposition conditions were as follows. The buffer layer 3 was deposited in a film thickness of 100 nm through sputtering using an Ar gas at a substrate temperature of 700° C.

Other points were the same as in those in Example 1.

Figure 4:
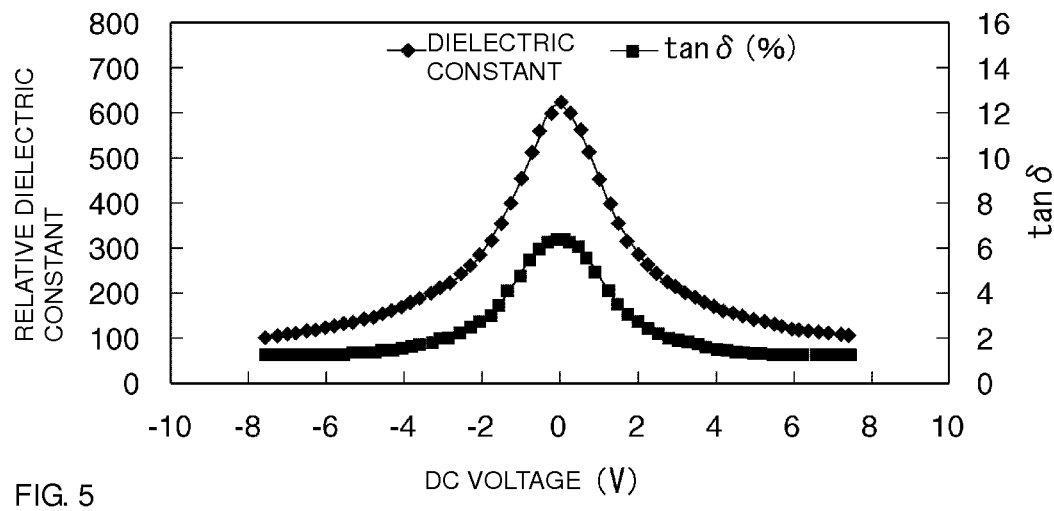
FIG. 4 is a diagram illustrating relationships between a relative dielectric constant and an applied voltage and between tan δ and the applied voltage in a variable capacitance element of Example 2, in which a buffer layer including a Pt(200) film and a BST film are stacked on a piezoelectric substrate that including 15° Y cut $LiNbO_3$ and further a Pt film is sacked thereon as a second electrode.

Relationships between a relative dielectric constant and an applied voltage and between tan δ and the applied voltage in the variable capacitance element obtained through Example 2 are illustrated in FIG. 4. FIG. 4 clearly reveals that the relative dielectric constant and tan δ changed more greatly than in Example 1 as the applied voltage changed. The rate of change in the relative dielectric constant, which is a ratio of the highest relative dielectric constant to the lowest relative dielectric constant within a range where the applied voltage is between −5 V and +5 V, was 4.17. Accordingly, it was discovered that a variable range of electrostatic capacity could be increased even further in Example 2 than in Example 1.

Figure 7:
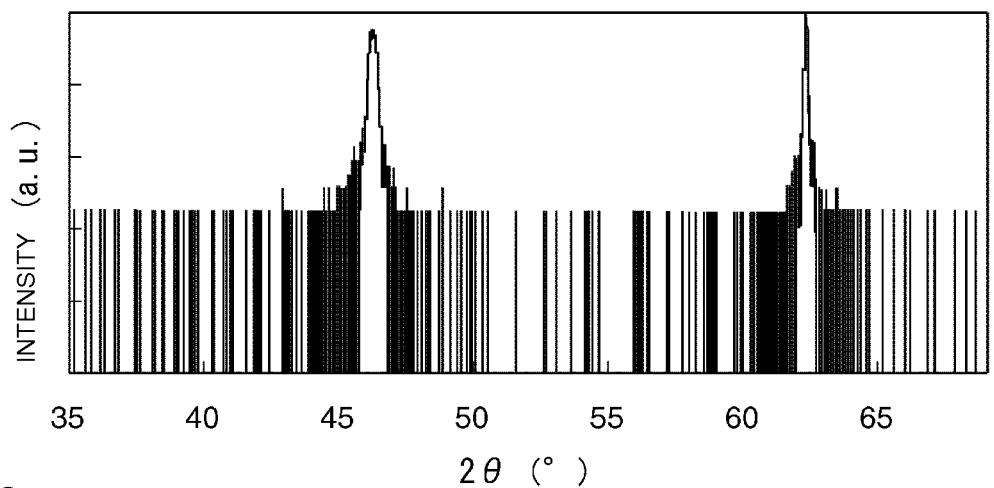
FIG. 7 is a diagram illustrating an x-ray diffraction result of measurement taken with a surface direction of Example 2 being inclined by 15° to match with the Y-plane of $LiNbO_3$.

As for the variable capacitance element of Example 2, similarly to Example 1, the orientation in each layer was confirmed through x-ray diffraction. The result is illustrated in FIG. 7. FIG. 7 clearly reveals that a peak resulting from the Pt(200) film was observed while 2θ was around 47° and a peak resulting from the LiNbO$_3$(300) substrate was observed while 2θ was around 63° in Example 2. It should be noted that FIG. 7 illustrates the result of the measurement obtained with the variable capacitance element being inclined by 15° from the substrate face to match with the Y-axis direction of the substrate.

Example 3

The buffer layer 3 having a cubic crystal structure and including the Pt(111) film was formed on the piezoelectric substrate that is formed of −1° Y cut LiNbO$_3$, and a variable capacitance element was obtained thereafter in a similar manner to Example 1. The Pt(111) film was deposited in a film thickness of 100 nm through sputtering using an Ar gas at a substrate temperature of 400° C.

Figure 8:
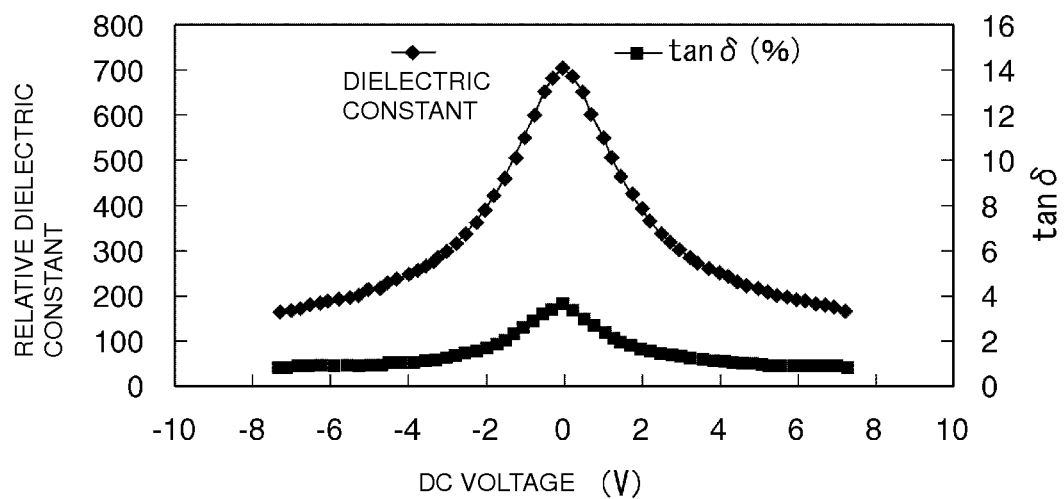
FIG. 8 is a diagram illustrating relationships between a relative dielectric constant and an applied voltage and between tan δ and the applied voltage in a variable capacitance element of Example 3, in which a buffer layer including a Pt(111) film and a BST film are located on a piezoelectric substrate that includes −1° Y cut $LiNbO_3$ and a second electrode is provided thereon.

Relationships between a relative dielectric constant and an applied voltage and between tan δ and the applied voltage in the variable capacitance element obtained through Example 3 are illustrated in FIG. 8. FIG. 8 clearly reveals that as the applied voltage changed, the relative dielectric constant and tan δ also changed.

Further, the rate of change in the relative dielectric constant within a range where the applied voltage is between −5 V and +5 V was 3.34, which was greater than in Example 1 but smaller than in Example 2.

Figure 10:
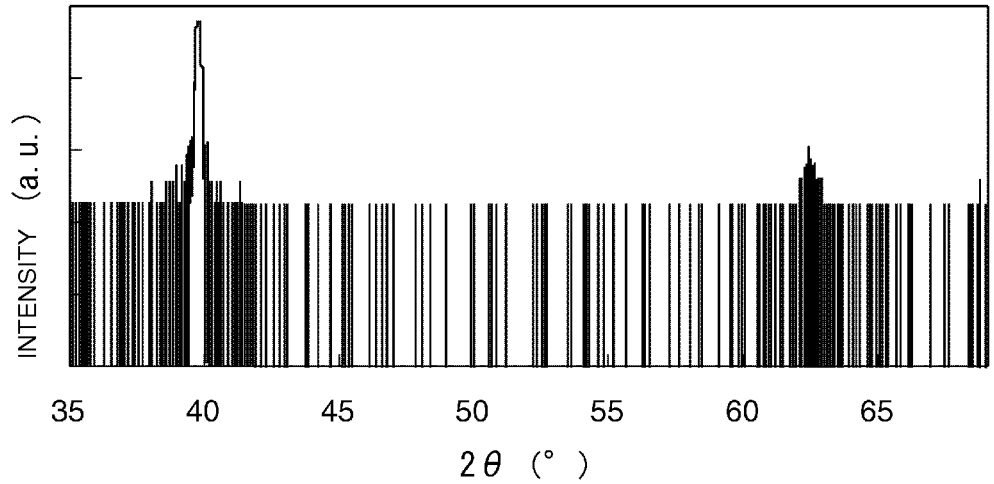
FIG. 10 is a diagram illustrating an x-ray diffraction result of Example 3.

As for the variable capacitance element of Example 3, the crystal orientation was confirmed through x-ray diffraction, similarly to Example 1. The result is illustrated in FIG. 10. FIG. 10 clearly reveals that a peak resulting from the Pt(111)

film was observed while 2θ was around 40°. Further, since the substrate was −1° Y cut LiNbO$_3$ (since being inclined only by −1°), a peak resulting from the LiNbO$_3$(300) plane was observed while 2θ was around 63°, even though the measurement was on a plane parallel to the substrate surface.

Example 4

The buffer layer 3 having a cubic crystal structure and formed of the Pt(200) film was formed on the piezoelectric substrate formed of 27.5° Y cut LiNbO$_3$, and a variable capacitance element was obtained thereafter in a similar manner to Example 1. The Pt(200) film was deposited in a film thickness of 100 nm through sputtering using an Ar gas at a substrate temperature of 700° C.

Figure 9:
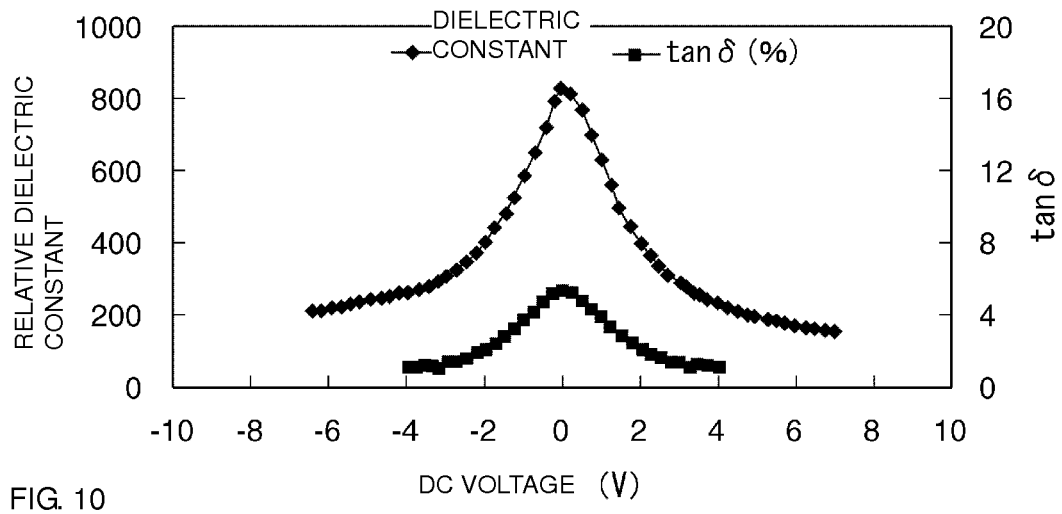
FIG. 9 is a diagram illustrating relationships between a relative dielectric constant and an applied voltage and between tan δ and the applied voltage in a variable capacitance element of Example 4, in which a buffer layer including a Pt(200) film and a BST film are located on a piezoelectric substrate that includes 27.5° Y cut $LiNbO_3$ and a second electrode is provided thereon.

Relationships between a relative dielectric constant and an applied voltage and between tan δ and the applied voltage in the variable capacitance element obtained through Example 4 are illustrated in FIG. 9.

FIG. 9 clearly reveals that as the applied voltage changed, the relative dielectric constant and tan δ also changed. Further, the rate of change in the relative dielectric constant within a range where an applied voltage was between −5 V and +5 V was as large as 4.28.

As for the variable capacitance element obtained through Example 4 as well, the crystal orientation was confirmed through x-ray diffraction, similarly to Example 2. The result is illustrated in FIG. 11.

Figure 11:
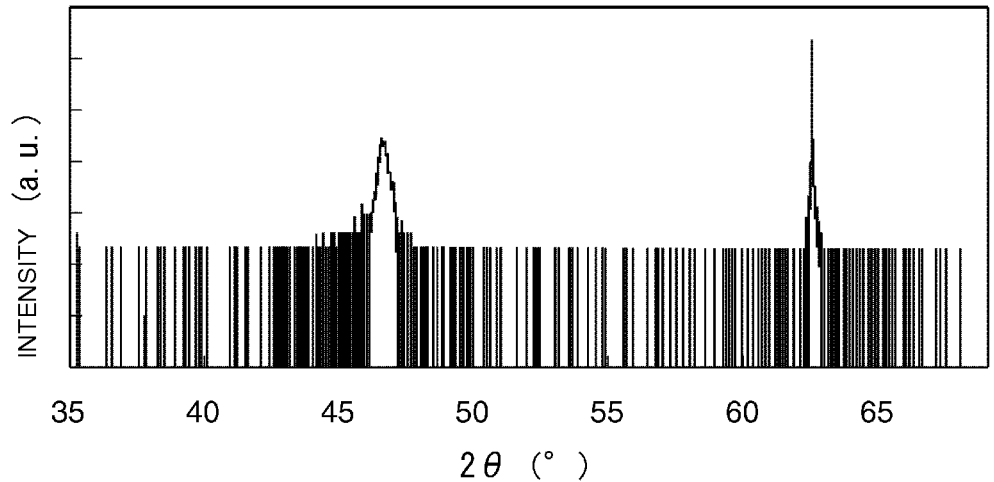
FIG. 11 is a diagram illustrating an x-ray diffraction result of measurement taken with a surface direction of Example 4 being inclined by 27.5° to match with the Y-plane of $LiNbO_3$.

FIG. 11 clearly reveals that a peak resulting from the Pt(200) was observed while 2θ was around 46° and a peak resulting from LiNbO$_3$(300) was observed while 2θ was around 63°. It should be noted that FIG. 11 illustrates the result of the measurement obtained with the variable capacitance element being inclined by 27.5° from the substrate plane to match with the Y-axis direction of the substrate.

As can be seen clearly from Examples 1 to 4 described above, the rate of change in the relative dielectric constant and the value of tan δ can be varied by modifying the crystal orientation of the Pt film that constitutes the buffer layer 3. That is, the comparison between Example 1 and Example 2 reveals that a change in the relative dielectric constant caused by an applied voltage can be increased further when the Pt(200) film is used than when the Pt(111) film is used. Meanwhile, tan δ is relatively large. In this way, by changing the orientation of the Pt film, a desired rate of change in the relative dielectric constant and a desired value of tan δ can be obtained.

In addition, the comparison between Example 1 and Example 3 reveals that the rate of changes in the relative dielectric constant and in tan δ caused by the applied voltage can be increased by modifying a cut-angle of LiNbO$_3$ from 15° to −1°, even if the buffer layer 3 formed of the same Pt(111) film is formed. That is, it can be seen that the variable range of electrostatic capacity can be increased by using −1° Y cut LiNbO$_3$, rather than using 15° Y cut LiNbO$_3$.

Similarly, the comparison between Example 2 and Example reveals that the rate of change in the relative dielectric constant can be increased to some extent by using 27.5° Y cut LiNbO$_3$, rather than using 15° Y cut LiNbO$_3$.

Thus, as can be seen clearly from Examples 1 to 4, it is desirable that the crystal orientation of the buffer layer 3 and the cut-angle of the piezoelectric substrate such as LiNbO$_3$ are set to the ranges described above.

Further, according to the first preferred embodiment described above, it can be seen that because the buffer layer 3 is formed on the piezoelectric substrate 2 before depositing the dielectric layer 4 including BST whose relative dielectric constant varies in accordance with an applied voltage, the variable capacitance element 1 with good variation characteristics of the relative dielectric constant by an applied voltage can be constructed.

Preferred embodiments of a tunable filter of the present invention will be described below.

Figure 12A:
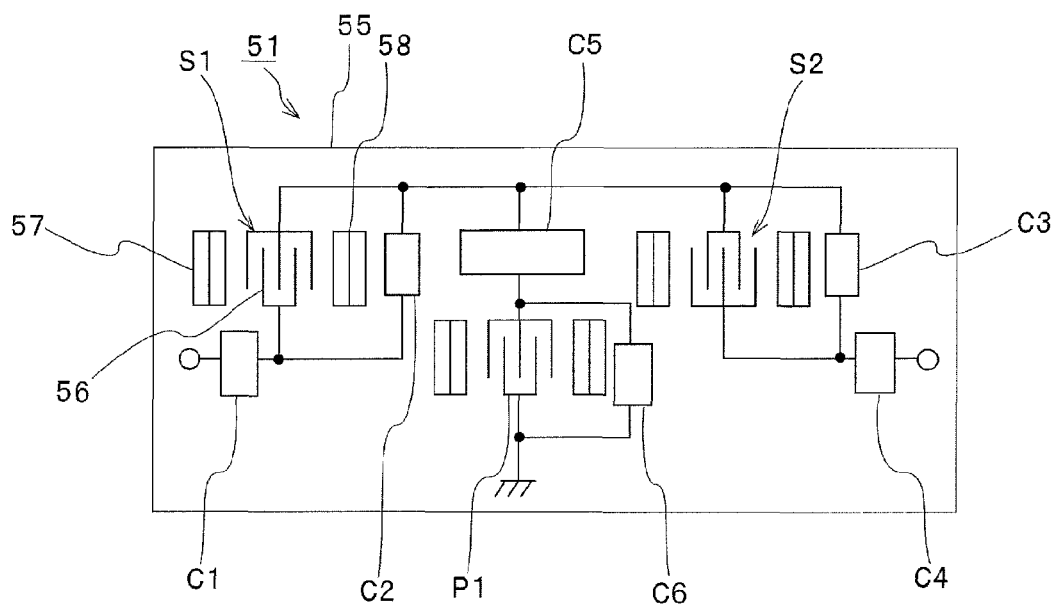
FIG. 12A is a circuit diagram of a tunable filter according to the first preferred embodiment of the present invention.
Figure 13:
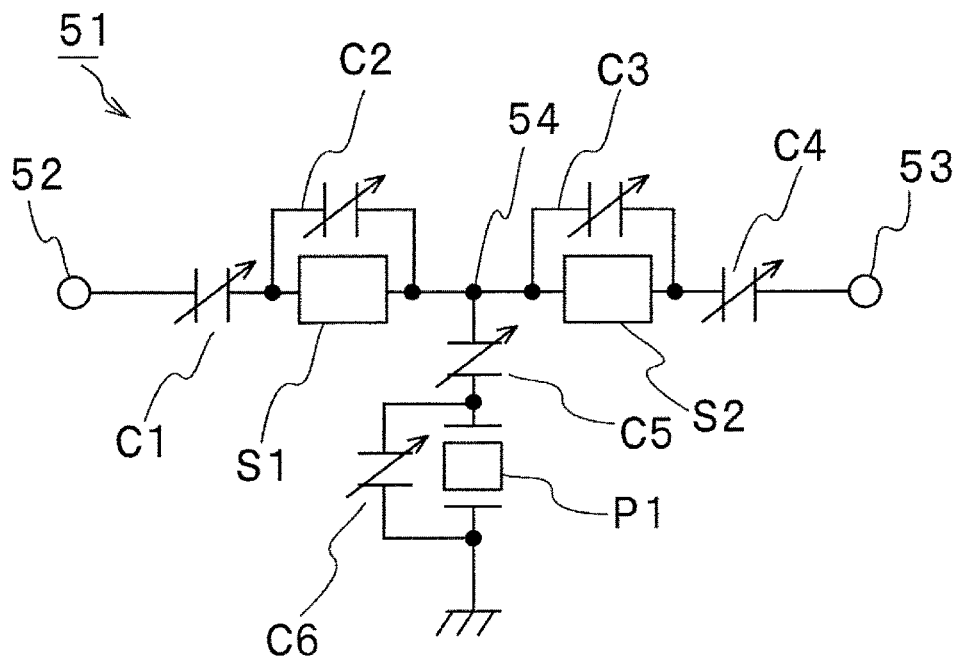
FIG. 13 is a circuit diagram of a tunable filter that is realized through an electrode structure on a piezoelectric substrate illustrated in FIG. 12A.

FIG. 12A is a schematic plan view illustrating an electrode structure of a tunable filter according to a third preferred embodiment of the present invention, and FIG. 13 is a circuit diagram thereof.

As illustrated in FIG. 13, a tunable filter 51 includes an input terminal 52 and an output terminal 53. First and second series arm resonators S1 and S2 are arranged in series in a series arm that connects the input terminal 52 with the output terminal 53.

A first variable capacitor C1 is connected between the input terminal 52 and the first series arm resonator S1. Further, a second variable capacitor C2 is connected in parallel with the first series arm resonator S1. A third variable capacitor C3 is connected in parallel with the second series arm resonator S2. A fourth variable capacitor C4 is connected between the second series arm resonator S2 and the output terminal 53. Further, a fifth variable capacitor C5 and a parallel arm resonator P1 are connected in series between a node 54 between the first and second series arm resonators S1 and S2 and the ground potential. A sixth variable capacitor C6 is connected in parallel with the parallel arm resonator P1.

As described above, the tunable filter 51 has a ladder circuit configuration that includes the first and second series arm resonators S1 and S2 and the parallel arm resonator P1.

As illustrated schematically in FIG. 12A, the first and second series arm resonators S1 and S2 and the parallel arm resonator P1 that each include a surface acoustic wave resonator are formed on a piezoelectric substrate 55 so as to have the circuit configuration described above. For example, with the first series arm resonator S1 taken as an example, the first series arm resonator S1 includes an IDT electrode 56 and reflectors 57 and 58 that are arranged at both sides of the IDT electrode 56 in the propagation direction of the surface acoustic wave.

Each of the first and second series arm resonators S1 and S2 and the parallel arm resonator P1 is a piezoelectric resonant device that includes a surface acoustic wave resonator. Accordingly, the first series arm resonator S1 can be constructed merely by providing the IDT electrode 56 and the reflectors 57 and 58 that constitute the surface acoustic wave resonator on the piezoelectric substrate 55.

In addition, configuration portions of the first to sixth variable capacitors C1 to C6 described above are indicated schematically with rectangular blocks in FIG. 12A, but the first to sixth variable capacitors C1 to C6 are provided in dielectric layers. Accordingly, the variable capacitors C1 to C6 can also be formed easily only by depositing a plurality of films on the piezoelectric substrate. Thus, reduction in size and simplification of a manufacturing process can be achieved. The above will be described with reference to FIG. 12B with a structure portion of the second variable capacitor C2 taken as an example.

Figure 12B:
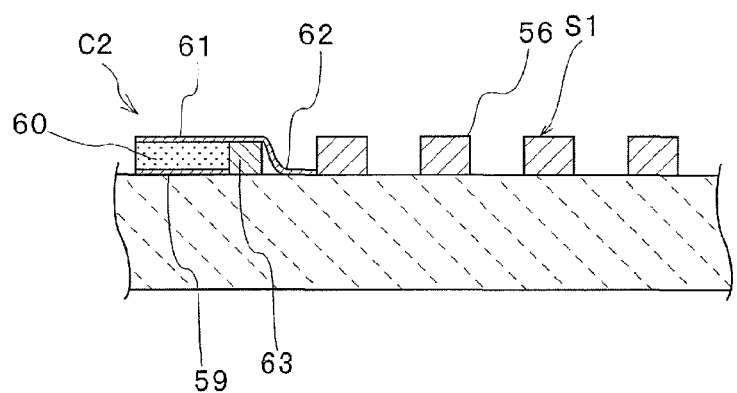
FIG. 12B is a fragmentary cross-sectional view illustrating a main portion thereof.

FIG. 12B is a cross-sectional view schematically illustrating the second variable capacitor C2 and a portion where the first series arm resonator S1 is formed. The second variable capacitor C2 includes a lower electrode 59 defining a first capacitance electrode. A dielectric layer 60 that includes BST is stacked on the lower electrode 59. An upper electrode 61 defining a second capacitance electrode is stacked on the dielectric layer 60 so as to oppose the lower electrode 59 with the dielectric layer 60 interposed therebetween. The upper electrode 61 is connected to the IDT electrode 56 through a wire electrode 62.

It should be noted that an insulator layer 63 is arranged so as to be in contact with the dielectric layer 60 in order to prevent a short between the upper electrode 61 and wire electrode 62, and the lower electrode 59. The wire electrode 62 is connected to the upper electrode 61 and extends toward the IDT electrode 56 along an upper surface of the insulator layer 63. The lower electrode 59 includes Pt in the present preferred embodiment, and the upper electrode 61 includes Pt.

The dielectric layer 60 includes BST, that is, barium strontium titanate ($Ba_xSr_{1-x}TiO_3$, here, x is a number greater than 0 but less than 1).

Further, in particular, $LiNbO_3$ with Euler angles of (0°, 60° to 120°, 0°) is preferable as the piezoelectric substrate. As long as Euler angles are within this range, by applying the buffer layer described above, similar effects to those illustrated in Examples 1 to 4 can be obtained. Further, a large electromechanical coupling coefficient can be obtained within the aforementioned range, that is, the aforementioned range is suitable because the frequency variable width can be increased in the tunable filter. In addition, as described above, if an $LiNbO_3$ substrate with Euler angles of the aforementioned range is used, a variable capacitor with a variable capacitance range of about 2.78 times or more can be realized.

Figure 14:
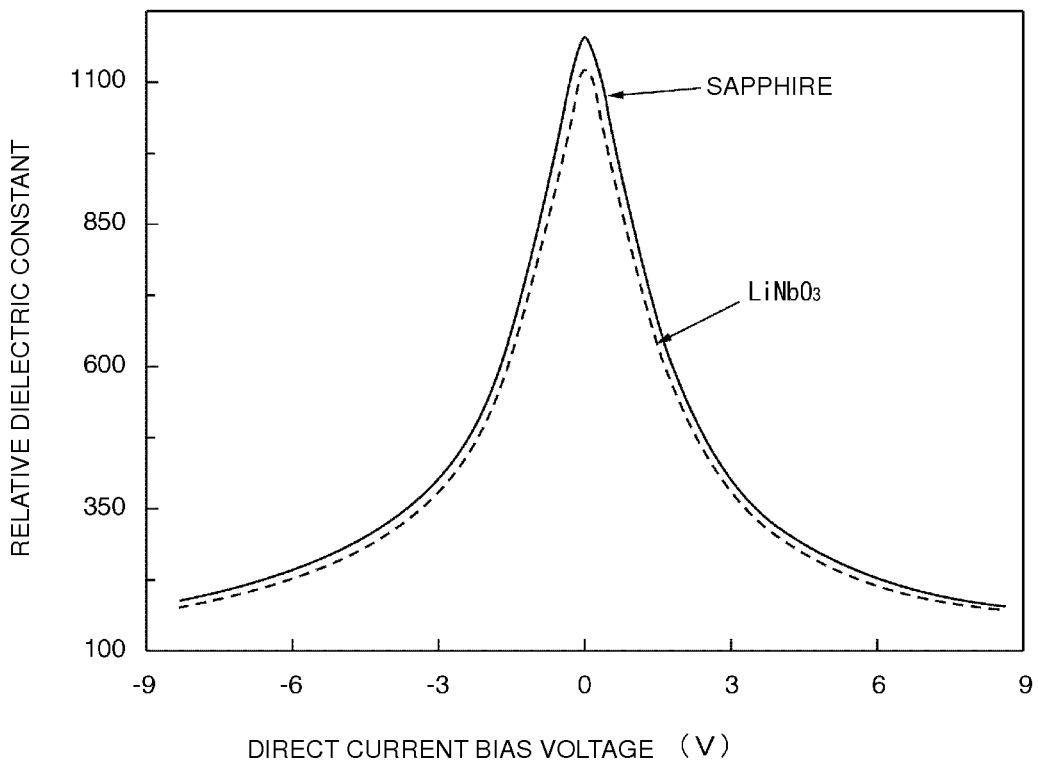
FIG. 14 is a diagram illustrating a relationship between an applied voltage and a relative dielectric constant in each of the structures in which a BST film is deposited on a sapphire substrate and on an $LiNbO_3$ substrate.

Further, FIG. 14 is a diagram illustrating a relationship between a relative dielectric constant and an applied voltage in each of the structures in which a BST film is deposited on a −1° Y cut $LiNbO_3$ substrate and on a sapphire R-plane substrate. FIG. 14 clearly reveals that the structure in which the BST film is deposited on the $LiNbO_3$ substrate with the aforementioned Euler angles yields similar relative dielectric constant characteristics to the structure in which the BST film is deposited on the sapphire R-plane substrate. Thus, according to the present preferred embodiment, it is understood that by depositing BST directly, or indirectly through a buffer layer, onto the piezoelectric substrate 55 preferably made of $LiNbO_3$, a small and excellent variable capacitor can be constructed. Further, the BST film on the $LiNbO_3$ substrate illustrated in FIG. 14 is a film that is doped with N, and it can be seen that the BST film has better characteristics, that is, a greater rate of change in the relative dielectric constant than the BST films illustrated in FIG. 3, FIG. 4, FIG. 8, and FIG. 9. In this way, the BST film may be doped with N, Gd, Ca, Zr, Hf, Ge, or the like. In this case, as described above, a large capacitance change rate can be realized. Note that Gd and Ca are doped on a Ba site, Zr, Hf, and Ge are doped on a Ti site, and N is doped on an O site. Further, the doping amount of each is equal to or less than about 5%, for example.

In a BST film, the relative dielectric constant varies in accordance with an applied voltage. Accordingly, with the tunable filter 51 of the present preferred embodiment, the capacitance of the first to sixth variable capacitors C1 to C6 can be varied by adjusting the applied voltages. As a result, the filter characteristics of the tunable filter can be changed. That is, selected frequencies can be adjusted.

Figure 15:
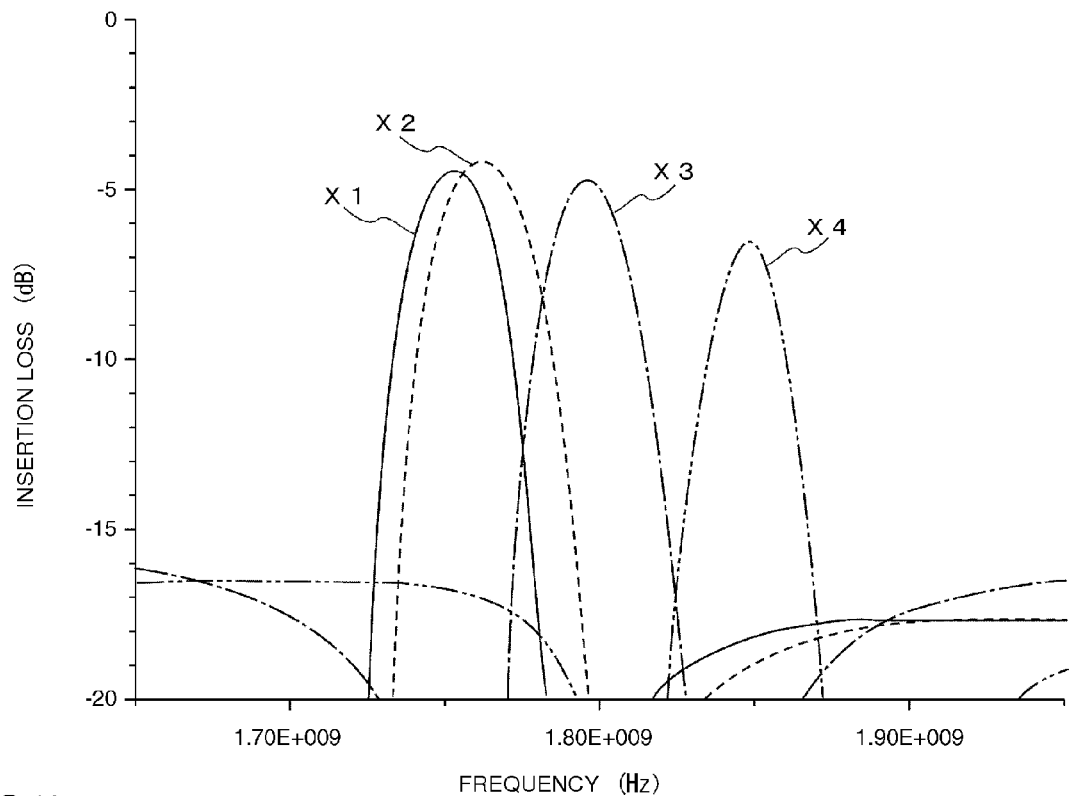
FIG. 15 is a diagram illustrating changes in filter characteristics when the capacitance of the variable capacitor formed of BST in the tunable filter of the first preferred embodiment is varied.

FIG. 15 is a diagram illustrating filter characteristics in the cases where the above-described first to sixth variable capacitors C1 to C6 are set to each of the combinations of X1 to X4 illustrated in Table 1 below.

TABLE 1

|    | C5    | C6     | C1, C4 | C2, C3 |
|----|-------|--------|--------|--------|
| X1 | 4 pF  | 6 pF   | 0.8 pF | 1 pF   |
| X2 | 4 pF  | 5 pF   | 0.8 pF | 0.8 pF |
| X3 | 2 pF  | 3 pF   | 0.4 pF | 0.5 pF |
| X4 | 1 pF  | 1.2 pF | 0.2 pF | 0.2 pF |

As can be seen clearly from FIG. 15, by setting the electrostatic capacity of the first to sixth variable capacitors C1 to C6 to each of the combinations of X1 to X4 by adjusting the applied voltages, the filter characteristics of the tunable filter 51, in particular, the frequency characteristics thereof can be greatly changed.

It should be noted that although a tunable filter of a ladder circuit configuration that includes the series arm resonators S1 and S2 and the parallel arm resonator P1 is illustrated in the above-described preferred embodiment, the circuit configuration of the tunable filter of the present invention is not particularly limited.

Figure 16:
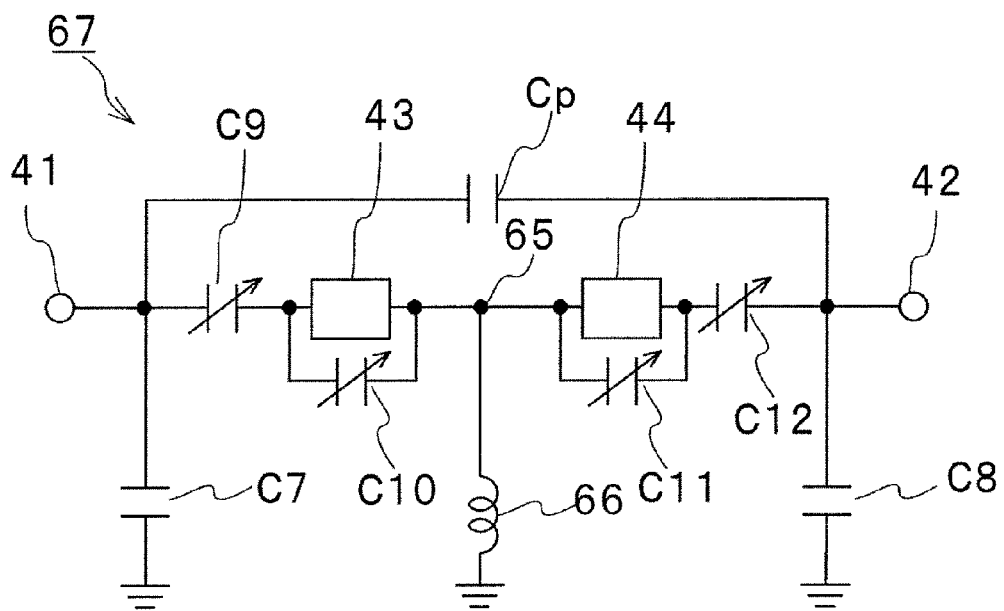
FIG. 16 is a circuit diagram of a modification of a tunable filter constructed according to a preferred embodiment of the present invention.

In a modification illustrated in FIG. 16, piezoelectric resonators 43 and 44 are connected between an input terminal 41 and an output terminal 42. A capacitor C7 is connected between the input terminal 41 and the ground potential. A capacitor C8 is connected between the output terminal 42 and the ground potential. Further, an inductor 66 is connected between a node 65 between the piezoelectric resonators 43 and 44 and the ground potential. Then, a capacitor Cp is connected between the input terminal 41 and the output terminal 42 so as to be in parallel with the piezoelectric resonators 43 and 44. A variable capacitor C9 is connected between the piezoelectric resonator 43 and the input terminal 41. A variable capacitor C10 is connected in parallel with the piezoelectric resonator 43. A variable capacitor C11 is connected in parallel with the piezoelectric resonator 44. Further, a variable capacitor C12 is connected between the piezoelectric resonator 44 and the output terminal 42. A tunable filter 67 having such a circuit configuration may be used. In the tunable filter 67 as well, by forming each of the variable capacitors C9 to C12 of a variable capacitor in which a dielectric layer such as a BST film is used, similarly to the above-described preferred embodiments, a significant reduction in size is achieved. In addition, since the variable capacitors C9 to C12 can be located directly adjacent to the piezoelectric resonant device, degradation of the characteristics due to a parasitic component can be significantly reduced or prevented.

Figure 17:
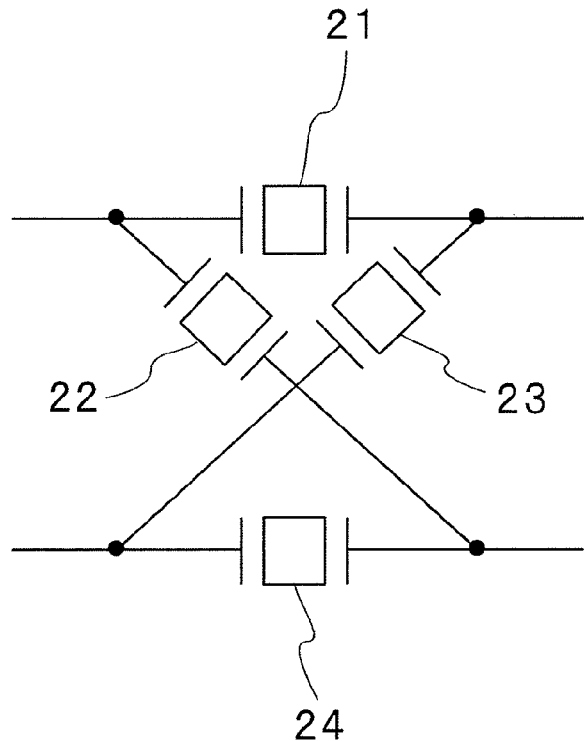
FIG. 17 is a circuit diagram illustrating another modification of the circuit configuration in a tunable filter according to a preferred embodiment of the present invention.

Further, the circuit configuration of the above-described tunable filter may be such that a plurality of piezoelectric resonators 21 to 24 are connected so as to have a lattice circuit configuration, as illustrated in FIG. 17 (in FIG. 17, a variable capacitance element that is to be connected in series or in parallel with a resonator is omitted).

Further, for example, in the tunable filter of a preferred embodiment of the present invention as illustrated in FIG. 13, a capacitance element that cuts direct current signal may be provided in a high-frequency signal wire circuit so that the direct current signal to be applied to the variable capacitance element does not leak, or a resistor or an inductor that cuts a high-frequency signal may be provided in a direct current wire circuit so that the high-frequency signal does not leak.

Figure 18:
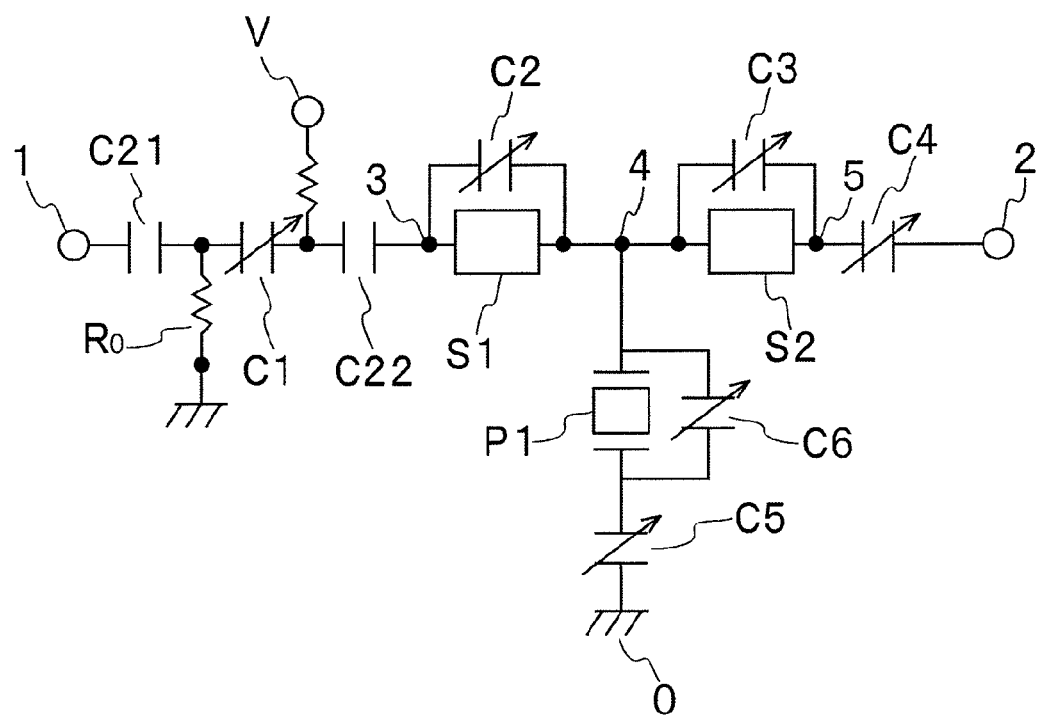
FIG. 18 is a circuit diagram illustrating another modification of the circuit configuration in a tunable filter according to a preferred embodiment of the present invention.
Figure 19:
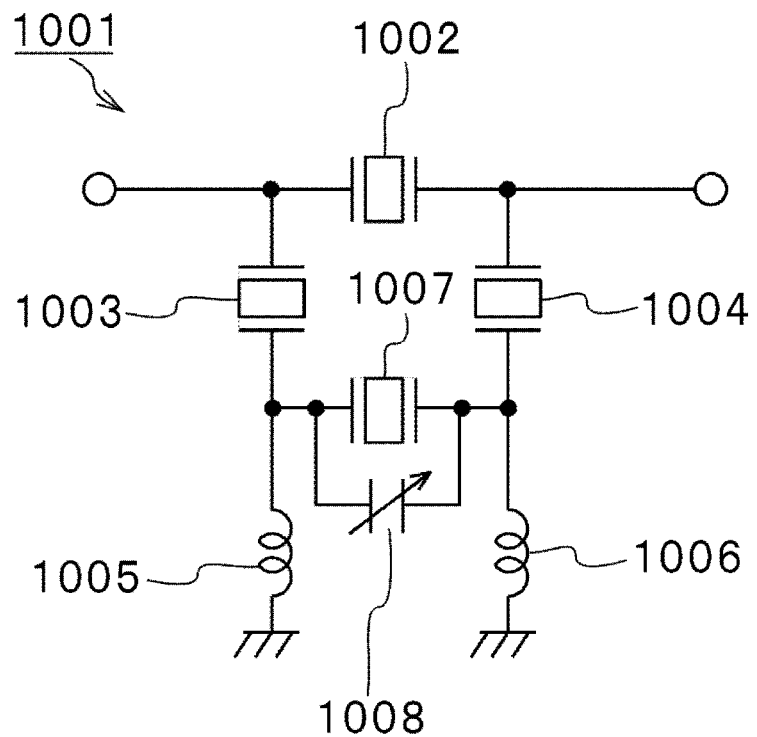
FIG. 19 is a circuit diagram of an existing piezoelectric device.
Figure 20:
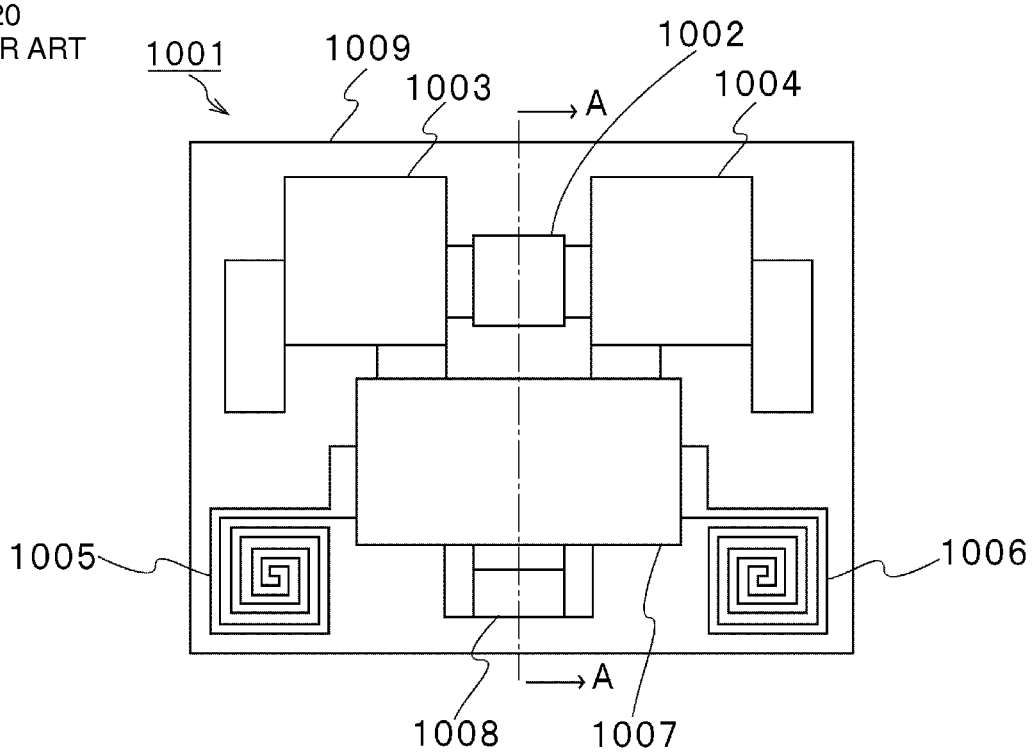
FIG. 20 is a schematic plan view of the existing piezoelectric device illustrated in FIG. 19.
Figure 21:
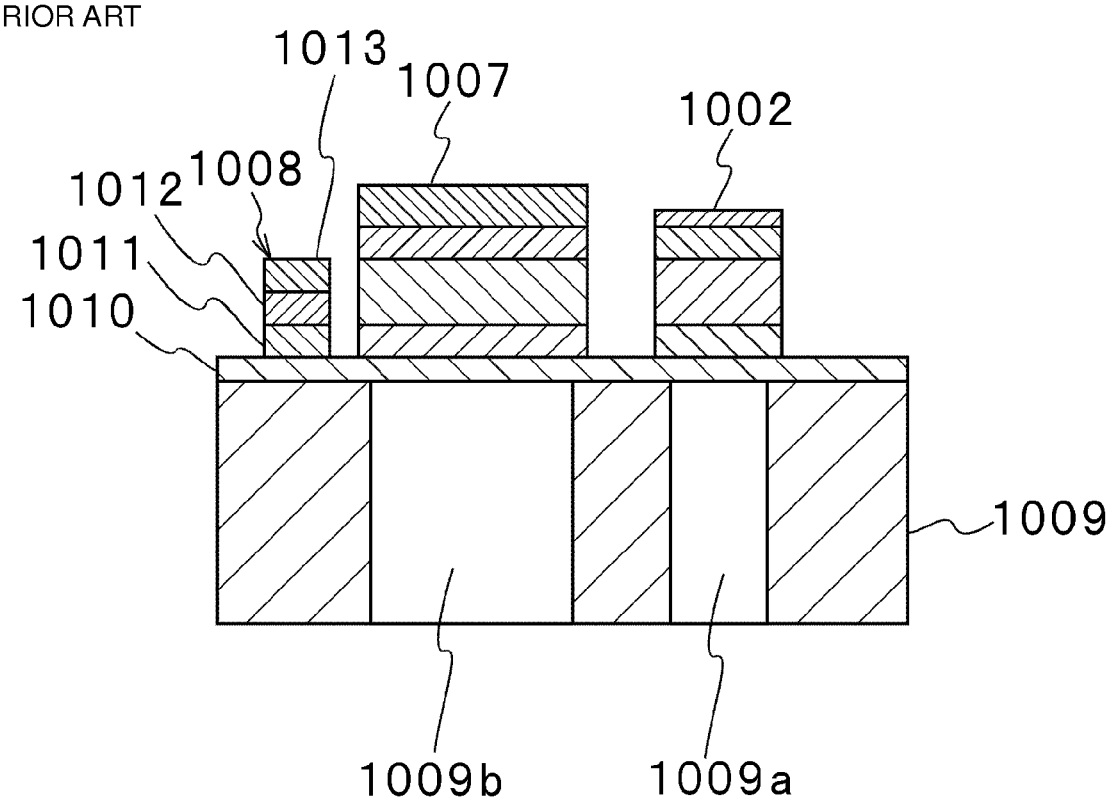
FIG. 21 is a cross-sectional view of a portion along the A-A line in FIG. 20.

For example, as illustrated in FIG. 18, capacitors C21 and C22 for cutting a direct current signal are inserted into a signal wire that connects an input terminal with a series arm so that the direct current signal does not leak into the high-frequency signal wire circuit. It should be noted that the capacitance that can cut the direct current component is sufficient, which may be approximately 100 pF, for example. This capacitance element may include BST. In this case, the capacitance element can be deposited simultaneously with the variable capacitance element, and thus the manufacturing process can be simplified. Note that the capacitance element may have fixed capacitance and does not need to be a variable capacitance element.

Further, as illustrated in FIG. 18, a resistance element $R_0$ that cuts a high-frequency signal is connected between a direct current power supply and a series arm or between the ground and the series arm so that the high-frequency signal does not leak into the direct current wire circuit. Note that the resistance of about 2 kΩ to about 30 kΩ is sufficient, for example. Further, the resistance element may be an inductor having similar impedance. The resistor can be formed by depositing a thin film of NiCr, TaN, or the like. It should be noted that although the capacitors that cut the direct current signal are preferably arranged on the high-frequency signal wire circuit and the resistance elements or the inductor elements that cut the high-frequency signal are preferably arranged on the direct current signal wire circuit for the variable capacitor C1 in this example, similar elements may be provided for any given variable capacitor other than C1.

Further, although a surface acoustic wave resonator is preferably used as the piezoelectric resonant device in a preferred embodiment of the tunable filter of the present invention, the present invention is not limited thereto, and a resonator of BAW (Bulk Acoustic Wave) or Lamb wave may also be used. In particular, a resonator may be a surface acoustic wave resonator in which the transversal wave is the main component or may be a BAW resonator that oscillates in a thickness-shear vibration mode. Alternatively, the resonator may be a Lamb-wave device that oscillates in a transversal wave vibration mode. In any of the above cases, since the electromechanical coupling coefficient can be increased, a tunable filter with large frequency variable width can be obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A tunable filter, comprising:
a variable capacitance element including:
  a piezoelectric substrate;
  a buffer layer located on the piezoelectric substrate and having an orientation;
  a dielectric layer located on the buffer layer, a relative dielectric constant of the dielectric layer varying in accordance with an applied voltage; and
  a first electrode and a second electrode that are arranged to apply an electric field to the dielectric layer; and
a resonator circuit unit located on the piezoelectric substrate of the variable capacitance element and including a piezoelectric resonant device connected to an input terminal and an output terminal; wherein
the variable capacitance element is connected to the resonator circuit unit; and
the piezoelectric substrate of the variable capacitance element is rotated Y cut $LiTaO_3$ or rotated Y cut $LiNbO_3$ and has Euler angles of (0°, 60° to 120°, 0°).

2. The tunable filter according to claim 1, wherein the piezoelectric resonant device is provided in a plurality, and a ladder circuit is defined of the plurality of piezoelectric resonant devices.

3. The tunable filter according to claim 2, wherein
the resonator circuit unit has a ladder circuit configuration that includes a series arm which connects an input terminal with an output terminal and a parallel arm which connects the series arm with a ground potential; and
the series arm and the parallel arm include at least one piezoelectric resonator.

4. The tunable filter according to claim 1, wherein a capacitance element that cuts out a direct current signal is connected in series with the variable capacitance element of the tunable filter.

5. The tunable filter according to claim 1, wherein a resistor or an inductor that cuts out a high-frequency signal is connected between the variable capacitance element and a ground or between the variable capacitance element and a direct current power supply.

6. The tunable filter according to claim 1, wherein the piezoelectric resonant device is a SAW device, or a Lamb-wave device.

7. The tunable filter according to claim 6, wherein the piezoelectric resonant device is a SAW device in which a transversal wave is a main component.

8. The tunable filter according to claim 6, wherein the piezoelectric resonant device is a Lamb-wave device in which a transversal wave vibration mode is a main component.

* * * * *